US007667374B2

(12) United States Patent
Aono et al.

(10) Patent No.: US 7,667,374 B2
(45) Date of Patent: Feb. 23, 2010

(54) ULTRASONIC TRANSDUCER, ULTRASONIC PROBE AND METHOD FOR FABRICATING THE SAME

(75) Inventors: Takanori Aono, Moka (JP); Tatsuya Nagata, Ishioka (JP); Hiroyuki Enomoto, Musashino (JP); Shuntaro Machida, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/657,186

(22) Filed: Jan. 23, 2007

(65) Prior Publication Data

US 2007/0222338 A1 Sep. 27, 2007

(30) Foreign Application Priority Data

Mar. 24, 2006 (JP) ............................ 2006-081897

(51) Int. Cl.
*H01L 41/00* (2006.01)

(52) U.S. Cl. ....................... 310/334; 310/366; 310/311; 310/309; 310/323.06

(58) Field of Classification Search ................. 310/334, 310/311, 309, 323.06, 366
See application file for complete search history.

(56) References Cited

U.S. PATENT DOCUMENTS

| | | | | |
|---|---|---|---|---|
| 5,295,487 | A * | 3/1994 | Saitoh et al. | 600/459 |
| 5,619,476 | A * | 4/1997 | Haller et al. | 367/181 |
| 6,271,620 | B1 * | 8/2001 | Ladabaum | 310/334 |
| 6,784,600 | B2 * | 8/2004 | Klee et al. | 310/366 |
| 7,185,972 | B2 * | 3/2007 | Tanikawa et al. | 347/71 |
| 2001/0046783 | A1 * | 11/2001 | Furusawa et al. | 438/736 |
| 2005/0140248 | A1 * | 6/2005 | Kuniyasu et al. | 310/334 |
| 2005/0248238 | A1 * | 11/2005 | Yamada et al. | 310/366 |
| 2005/0264617 | A1 * | 12/2005 | Nishimura et al. | 347/70 |

FOREIGN PATENT DOCUMENTS

| | | |
|---|---|---|
| JP | 2003/500955 T | 1/2003 |
| WO | WO 00/72631 A2 | 11/2000 |

* cited by examiner

*Primary Examiner*—Quyen Leung
*Assistant Examiner*—John K Kim
(74) *Attorney, Agent, or Firm*—Townsend and Townsend and Crew LLP

(57) ABSTRACT

In an ultrasonic transducer including a gap between an upper electrode and a lower electrode on a silicon substrate, it is made possible to reduce or adjust warpage of an above-gap membrane vibrated by electrostatic actuation due to internal stress. A fourth insulating film and a fifth insulating film of films positioned above the gap which is a cavity required for transmitting and receiving ultrasonic are respectively a silicon oxide film for compression stress and a silicon nitride film for tensile stress. Therefore, compression stress and tensile stress cancel each other, so that warpage of the above-gap membrane is reduced. An amount of warpage can be adjusted by adjusting a film thickness of the fourth insulating film and a film thickness of the fifth insulating film.

7 Claims, 5 Drawing Sheets

ULTRASONIC TRANSDUCER, ULTRASONIC PROBE AND METHOD FOR FABRICATING THE SAME

CROSS-REFERENCE TO RELATED APPLICATION

The present application claims priority from Japanese Patent Application No. JP 2006-081897 filed on Mar. 24, 2006, the content of which is hereby incorporated by reference into this application.

TECHNICAL FIELD OF THE INVENTION

The present invention relates to an ultrasonic probe for transmitting and receiving ultrasonic and an ultrasonic transducer using the same.

BACKGROUND OF THE INVENTION

A conventional ultrasonic probe applied in a field of examining a subject using ultrasonic has been disclosed, for example, in Japanese Patent Application Laid-Open Publication No. 2003-500955 (Patent Document 1). The invention or device disclosed in the Publication comprising a supporting member, a gap, an insulating film, an upper electrode, and a protective film disposed on a silicon substrate whose resistance has been reduced by doping. In the device, an insulator of silicon nitride, which is the supporting member, is formed and a lid of silicon nitride for closing a gap between the same and the insulator is formed on the insulator. Ultrasonic is transmitted and received by applying an electric signal between the upper electrode and the silicon substrate to vibrate the membrane above the gap.

SUMMARY OF THE INVENTION

In the ultrasonic probe which transmits and receives ultrasonic utilizing electrostatic actuation, it is necessary to form ultrasound transducers at high density. Micromachining based upon semiconductor manufacturing technique, or an MEMS (Micro Electro Mechanical Systems) technique is therefore utilized. In the microfabrication techniques, silicon is utilized as a base substrate, an insulating film and a metal film are stacked thereon, and a pattern is formed utilizing a photolithography or etching. As described in Patent Document 1, in a structure where the insulating film of silicon nitride, a metal film serving as the upper electrode, and a silicon nitride serving as the protective film thereon are stacked as an above-gap membrane, a warpage occurs in the above-gap membrane due to a difference (a bimetal effect) among internal stresses of the respective films and a gap size or width varies, which affects a condition of an electric signal to the ultrasonic transducer. Further, when the insulating film between the upper electrode and the silicon substrate are made of silicon nitride, charge injection tends to occur in the silicon nitride according to voltage application to the electrode, which results in high possibility that the characteristic of the ultrasonic probe is influenced by drift or the like.

An object of the present invention is to provide a membrane structure for reducing warpage of an above-gap membrane of an ultrasonic transducer used in an ultrasonic probe which transmits and receives ultrasonic according to electrostatic actuation to examine a subject.

In order to solve the above problem, a following method is provided.

Warpage of an above-gap membrane occurs due to an internal stress of a stacked film and a rigidity of a gap end portion. Therefore, the warpage can be reduced by designing a constitution of the above-gap membrane for balancing a compression stress and a tensile stress, and relaxing rigidity of a gap end portion. The constitution of the above-gap membrane includes a third insulating film, an upper electrode, a fourth electrode, and a fifth insulating film. Here it is preferable that a second insulating film and a third insulating film between the upper electrode and a lower electrode are made of silicon oxide in order to reduce charge injection. The upper electrode is made of material such as Al, Ti, Cu, or Mo used in a semiconductor process, or nitride or oxide thereof in combination. The fourth insulating film and the fifth insulating film are made of silicon oxide or silicon nitride, and warpage of the above-gap membrane is reduced by keeping balance between a compression stress and a tensile stress during a film-forming process. For example, silicon oxide for application of the compression stress is stacked as the fourth insulating film and silicon nitride for application of the tensile stress is stacked thereof. At this time, direction of warpage of the above-gap membrane can be controlled to a side of the gap or a side of a subject by changing thicknesses of the fourth insulating film and the fifth insulating film. When an ultrasonic transducer whose gap size or width is small is formed, the above-gap membrane can be warped to the side of the subject by making a compression stress film of the fourth insulating film thick and making a tensile stress film of the fifth insulating film thin, so that adhesion of the above-gap membrane to the substrate can be prevented.

According to the present invention, warpage of an above-gap membrane oscillated due to electrostatic actuation can be reduced and controlled, and drift due to charge injection occurring when a voltage is applied between the upper electrode and the lower electrode can be reduced.

BRIEF DESCRIPTIONS OF THE DRAWINGS

DESCRIPTIONS OF THE PREFERRED EMBODIMENT

First Embodiment

Figure 1:
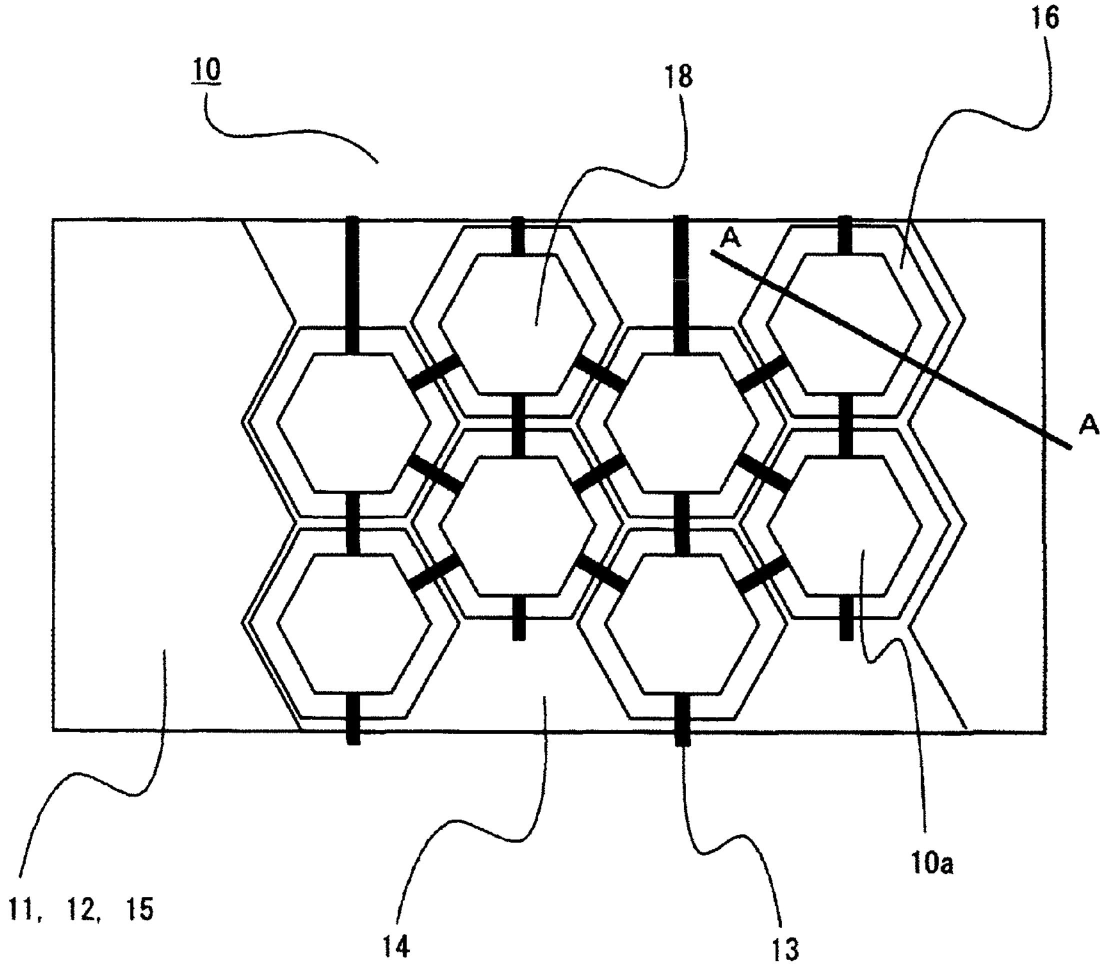
FIG. 1 is a top view of an ultrasonic transducer in a first embodiment of the present invention.

A first embodiment of the present invention will be explained with reference to FIG. 1 to FIG. 4. FIG. 1 is a top view of an ultrasonic probe in one embodiment of the present invention.

As shown in FIG. 1, an ultrasonic transducer 10 is configured by arranging a plurality of ultrasonic transducer cells 10*a* at high density. The ultrasonic transducer 10 has a structure that a gap 16 is provided between an upper electrode 18 and a lower electrode 14, where ultrasonic is transmitted and received by applying an electric signal (a voltage) between the upper electrode 18 and the lower electrode 14 to vibrate a membrane above the gap 16. Individual upper electrodes 18 are electrically connected via wires, and the lower electrode 14 is formed on a substrate over a plurality of ultrasonic transducer cells 10*a* as a large film. One ultrasonic transducer cell 10*a* has a diameter of 50 to 60 μm, and several thousands to a several tens thousands of ultrasonic transducer cells 10*a* constitute the ultrasonic transducer 10. Other ultrasonic transducer cells 10*a* are arranged around the eight ultrasonic transducer cells 10*a* shown in FIG. 1, but illustration thereof is omitted. In the embodiment, a hexagonal ultrasonic transducer cell 10*a* is shown, but the ultrasonic transducer cell 10*a* may be circular or polygonal, where it is preferable that the ultrasonic transducer cells be arranged at high density.

Figure 2:
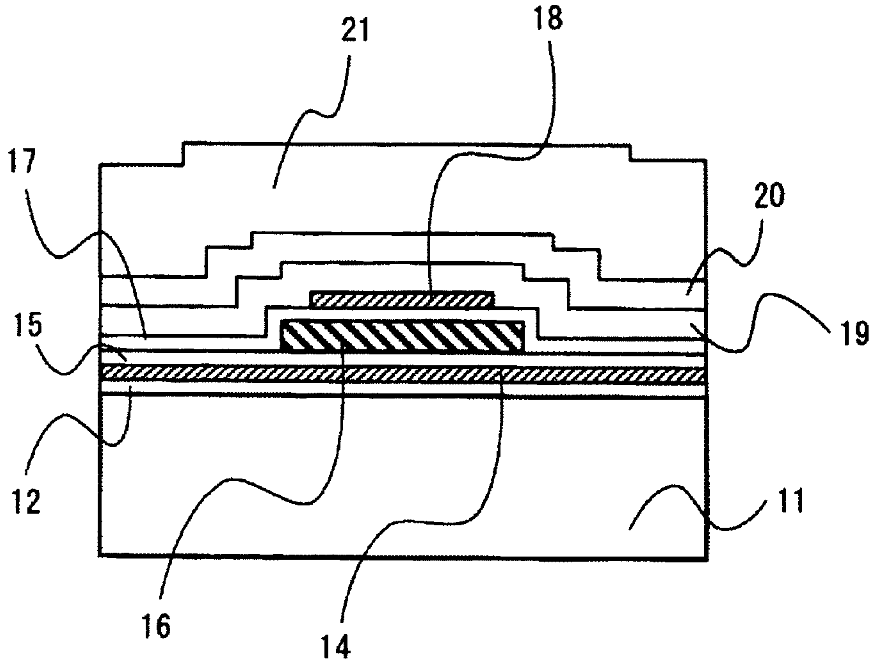
FIG. 2 is a sectional view of the ultrasonic transducer in the first embodiment of the present invention taken along line A-A.

FIG. 2 is a sectional view of the ultrasonic transducer in one embodiment of the present invention, taken along line A-A in FIG. 1. As shown in FIG. 2, the ultrasonic transducer 10 includes: (1) a first insulating film 12 positioned on a silicon substrate 11 for insulating the silicon substrate 11 and the lower electrode 14; (2) the lower electrode 14 and a wire 13 for transmitting an electric signal; (3) a second insulating film 15 for isolating the lower electrode 14 and an upper electrode 18 from each other; (4) the gap 16 having air or vacuum for vibrating an above-gap membrane; (5) a third insulating film 17 for isolating the lower electrode 14 and the upper electrode 18; (6) the upper electrode 18; (7) a fourth insulating film 19 and a fifth insulating film 20 for reducing a displacement amount of the above-gap membrane; and (8) a protective film 21 for protecting the ultrasonic transducer 10. Here, the third to fifth insulating films and the upper electrode film are collectively called "an above-gap membrane".

Figure 8:
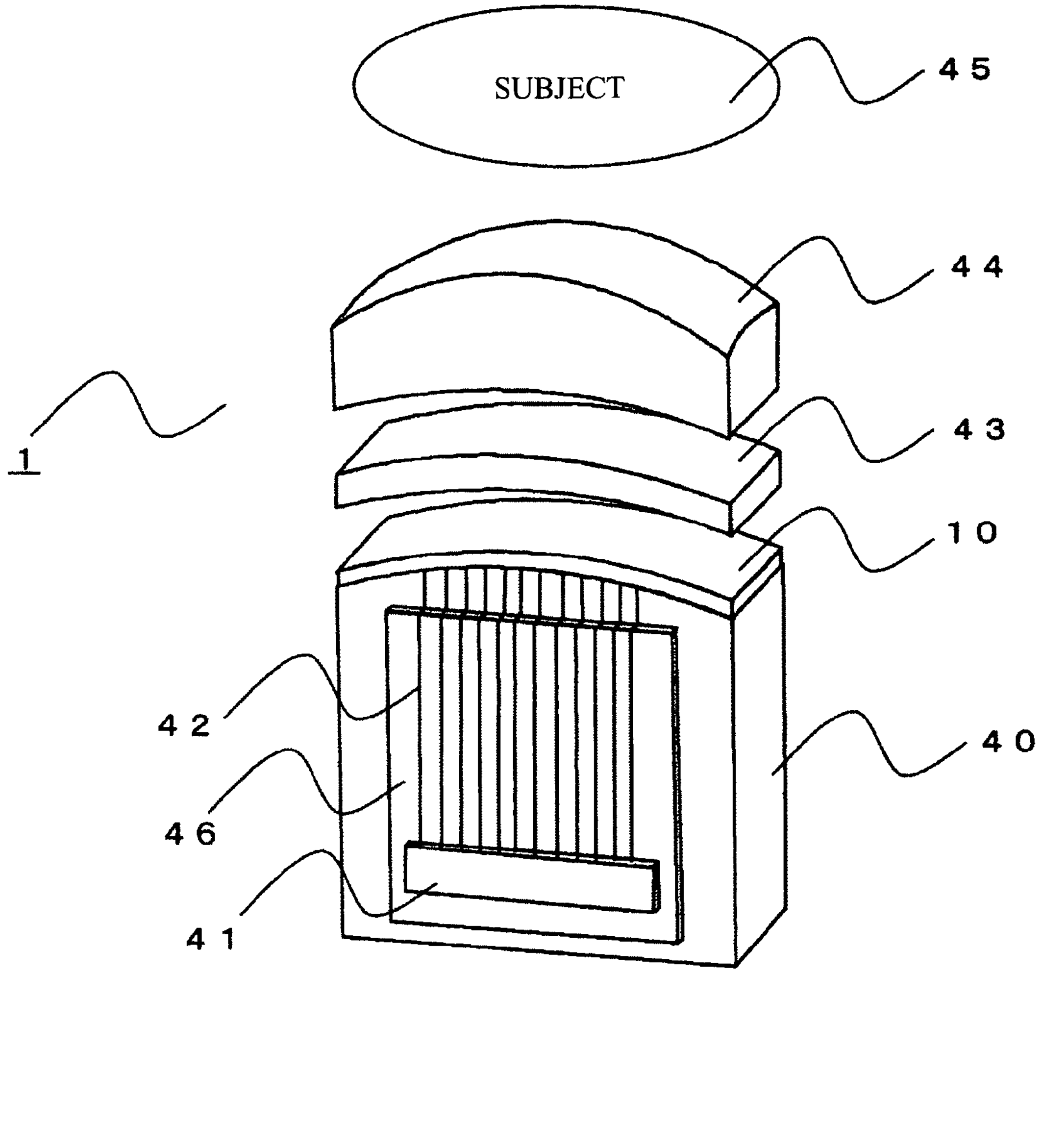
FIG. 8 is a perspective view of an ultrasonic probe utilizing the ultrasonic transducer of the first embodiment of the present invention.

An ultrasonic probe 1 including the ultrasonic transducer 10 is shown in FIG. 8. The ultrasonic probe 1 is used for examining human body (any disease in a circulatory system such as heart or blood vessel, an examination of cancer such as abdominal region cancer or prostate cancer, or unborn baby monitoring) in a medical organization. The ultrasonic probe 1 includes the ultrasonic transducer 10 at a distal end of a main unit 40 made of backing material and a wire 42 connected to a connector 41 is connected to the ultrasonic transducer. The ultrasonic transducer 10 is connected with a flexible substrate 46 having the wire 42 via the connector 41 and the ultrasonic transducer 10 is connected to an external connection system (not shown) via the connector 41 of the flexible substrate 46. The external connection system applies an electric signal to the ultrasonic transducer 10 to actuate the ultrasonic transducer 10, and it receives a wave from a subject to form an image. A matching layer 43 made of silicon gel for causing a subject to match with an acoustic impedance is provided ahead of the ultrasonic transducer 10. Since the acoustic impedance between the silicon in the ultrasonic transducer 10 and the subject is large, reflection at an interface therebetween becomes large. The matching layer 43 includes silicon gel for achieving matching of the sound impedance in order to reduce the reflection. An acoustic lens 44 made of silicon resin for focusing ultrasonic emitted from the ultrasonic transducer in a direction of a subject is provided ahead of the matching layer 43. The ultrasonic transducer 10 transmits and receives ultrasonic to and from a subject 45 such as human body via the matching layer 43 and the acoustic lens 44.

Figure 3A:
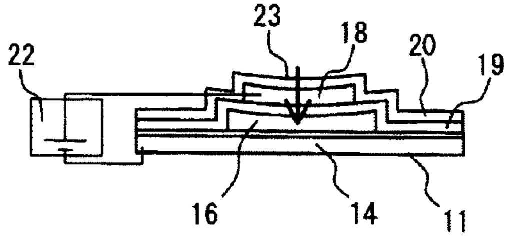
FIG. 3A is a diagram for describing an actuating method of the ultrasonic transducer of the present invention.
Figure 3C:
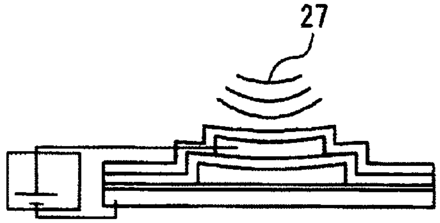
FIG. 3C is a diagram for describing the actuating method of the ultrasonic transducer of the present invention.
Figure 3B:
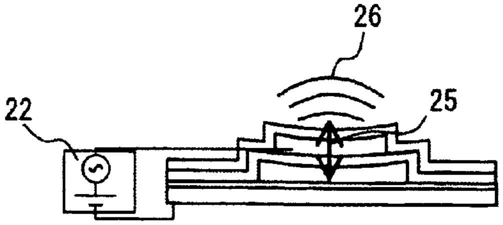
FIG. 3B is a diagram for describing the actuating method of the ultrasonic transducer of the present invention.
Figure 3D:
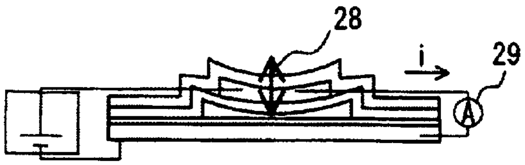
FIG. 3D is a diagram for describing the actuating method of the ultrasonic transducer of the present invention.

Transmission and reception operations of ultrasonic will be explained with reference to FIG. 3. A state that the gap 16 has been shortened to a fixed position is first achieved for transmitting ultrasonic by applying a DC voltage supplied from a power source 22 between the lower electrode 14 and the upper electrode 18 to generate an electrostatic force 23 (FIG. 3A). In this state, the power source 22 further applies an AC voltage between both the electrodes 14 and 18 to generate an electrostatic force 25 whose magnitude vibrates and vibrates the third, fourth, and fifth insulating films 17, 19, and 20 above the gap 16, thereby generating ultrasonic 26 (FIG. 3B). On the other hand, in order to receive ultrasonic, the gap 16 is deformed by applying a DC voltage between the lower electrode 14 and the upper electrode 18 in advance (FIG. 3C), and the gap 16 is expanded and contracted by introducing the ultrasonic 27 reflected from the subject into the gap 16 so that vibrations 28 is induced into upper films 17, 18, 19, and 20 (FIG. 3D). At this time, a distance between the lower electrode 14 and the upper electrode 18 varies and capacitance changes and a detecting circuit 29 detects an AC current generated due to the change so that the reception is performed.

Here, for applying a voltage between the upper electrode 18 and the lower electrode 14 to vibrate the above-gap membrane, it is preferable that films formed of silicon oxide to which charge injection is reduced to be used as the second insulating film and the third insulating film for isolating the upper electrode 18 and the lower electrode 14 from each other. The ultrasonic transducer 10 is actuated by electrostatic force generated by applying a voltage across the upper electrode 18 and the lower electrode 14. At this time, when charge injection occurs so that charges are accumulated at a defect level present in the insulating film between the upper electrode 18 and the lower electrode 14, an initial gap size is made small, which results in electric drift causing capacitance change. The capacitance change affects transmission and reception of ultrasonic, which results in deterioration of sensitivity for transmission and reception, namely, image-capturing sensitivity. Characteristic change due to electric drift of the ultrasonic transducer at a time of use can be reduced by reducing charge injection. Silicon nitride which tends to cause electric drift due to charge injection may be used, but it is necessary to correct characteristic change of the ultrasonic transducer through an external system.

Next, since the distance between gaps 16 or size of the gap 16 affects characteristic of ultrasonic, it is necessary to adjust warpage of the above-gap membrane. It is necessary to control rigidity of the gap end portion and internal stress in the above-gap membrane in order to adjust the warpage of the above-gap membrane.

Figure 4A:
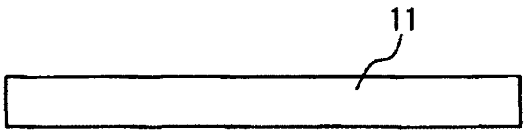
FIG. 4A is a diagram for describing a fabrication method of the ultrasonic transducer of the present invention.
Figure 4B:
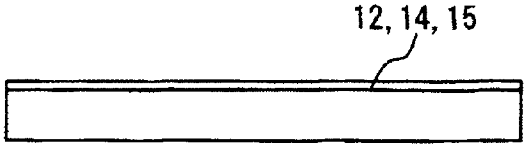
FIG. 4B is a diagram for describing the fabrication method of the ultrasonic transducer of the present invention.
Figure 4C:
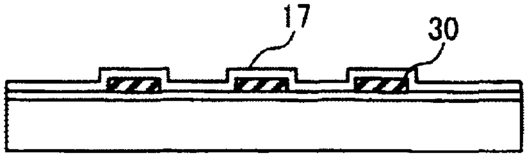
FIG. 4C is a diagram for describing the fabrication method of the ultrasonic transducer of the present invention.
Figure 4D:
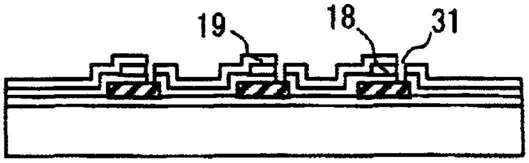
FIG. 4D is a diagram for describing the fabrication method of the ultrasonic transducer of the present invention.
Figure 4E:
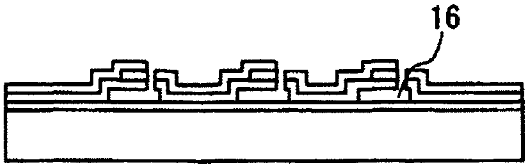
FIG. 4E is a diagram for describing the fabrication method of the ultrasonic transducer of the present invention.
Figure 4F:
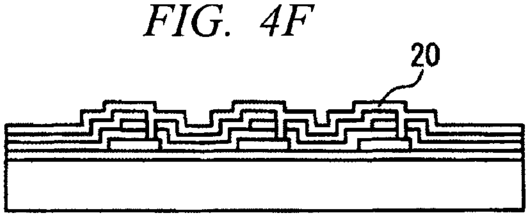
FIG. 4F is a diagram for describing the fabrication method of the ultrasonic transducer of the present invention.

The ultrasonic transducer 10 of the present invention is fabricated in the following manner. First, first and second insulating films 12 and 15 with a thickness of 50 nm are stacked on the silicon substrate 11 for an ultrasonic probe utilizing plasma CVD (Chemical Vapor Deposition) (FIG. 4A and FIG. 4B). Incidentally, the lower electrode 14 and the wire 13 are formed between the first and second insulating films 12 and 15. Next, after a sacrificial layer pattern 30 for forming the gap 16 is formed so as to have a thickness of 250 nm, the third insulating film 17 is stacked so as to have a thickness of 200 nm utilizing plasma CVD (FIG. 4C). Next, after the upper electrode 18 with a thickness of 400 nm and the fourth insulating film 19 with a thickness of 1200 nm are sequentially formed, a through-hole 31 for removing the sacrificial layer 30 is formed by photolithography/etching (FIG. 4D). After the gap 16 is formed by etching the sacrificial layer 30 (FIG. 4E), the fifth insulating film 20 for hole filling is stacked to have a thickness of 800 nm to be filled in the through-hole 31 for removing the sacrificial layer 30 (FIG. 4F).

As the structure of the ultrasonic transducer, a silicon oxide film in which it is difficult to pose charge injection, serving as the third insulating film 17, TiN/Al/TiN serving as the upper electrode 18, a silicon oxide film for compression stress (−150 MPa) serving as the fourth insulating film 19, and silicon nitride for tensile stress (100 MPa) serving as the fifth insulating film 20 are stacked. Here, for example, by setting a thickness of the silicon oxide film serving as the fourth insulating film 19 to 800 nm and setting a thickness of the silicon nitride film serving as the fifth insulating film 20 to 1200 nm, an ultrasonic transducer with a structure where deformation toward the subject side (the upward direction in the figure) has been performed by several tens nanometers can be formed. An ultrasonic transducer having a structure that deformation toward the gap side has been performed by several tens nanometers can be formed by stacking a silicon oxide for compression stress with a thickness of 200 nm as the fourth insulating film 19 and a silicon nitride for tensile stress with a thickness of 1800 nm as the fifth insulating film 20. Accordingly, a displacement amount of the above-gap membrane can be controlled by controlling internal stresses and thicknesses of the fourth insulating film 19 and the fifth insulating film 20. In the present embodiment, although the silicon oxide film for compression stress is formed as the fourth insulating film 19 and the silicon nitride film for tensile stress is formed as the fifth insulating film, the present invention is not limited to these. A silicon nitride film for compression stress may be formed as the fourth insulating film 19 and the silicon oxide film for tensile stress may be formed as the fifth insulating film. Further, even if a multi-layered insulating film is utilized, an effect of the present invention capable of adjusting warpage of the upper insulating film can be achieved as long as including combination of a film for compression stress and a film for tensile stress by properly selecting internal stresses and thicknesses of these films. Finally, a protective film 21 is disposed on the fifth insulating film. It is preferable that polyimide used for a semiconductor element to be used as the protective film 21.

As a method for controlling internal stress in the above-gap membrane, after the compression stress and the tensile stress are controlled according to the conditions at the film-formation time of the fourth insulating film 19 and the fifth insulating film 20 on the upper electrode 18, a displacement amount of the above-gap membrane is reduced by increasing/decreasing the film thickness. By adopting a constitution that a neutral axis of the internal stress of the above-gap membrane is disposed in the upper electrode 18 at this time, a structure where breaking due to electrode fatigue of the upper electrode 18 hardly occurs can be obtained.

Since the third insulating film 17 is positioned between the upper electrode and the lower electrode, when a film thickness thereof is made thicker, an electric capacitance increases so that the drive voltage must be set to a high voltage for achieving the same transmission and reception sensitivity of the ultrasonic transducer. On the other hand, when the film thickness is made thinner, it is necessary to consider a coverage of an edge portion at a time of sacrificial layer formation, a withstand voltage between the upper electrode and the lower electrode, or the like. The third insulating film 17 can be used for stress control but since change of a film thickness of the third insulating film 17 affects other portions, it is desirable that the displacement amount of the above-gap membrane is adjusted by changing the fourth and fifth insulating films 19 and 20. In the present invention, the fifth insulating film 20 is added as compared with the conventional constitution but since manufacture of the fifth insulating film 20 is performed utilizing the same step as the filling step of the through-hole 31, the number of manufacturing steps is not increased.

Second Embodiment

Figure 5:
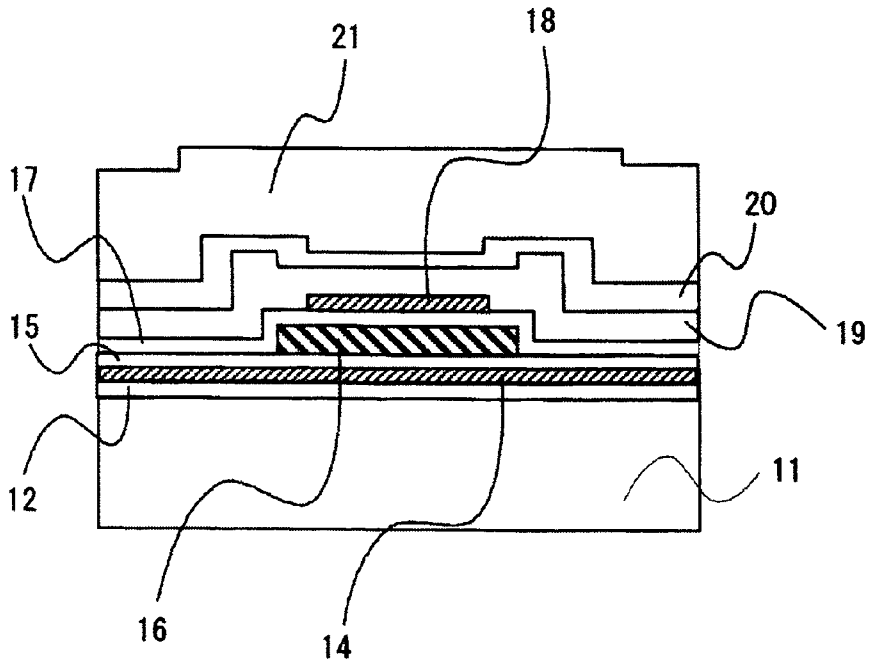
FIG. 5 is a sectional view of an ultrasonic transducer of a second embodiment of the present invention taken along line A-A.

FIG. 5 shows a second embodiment of the present invention. As a method for increasing rigidity of the above-gap membrane, the second embodiment is a method for forming insulating films (especially, the fourth insulating film 19) positioned just above the gap end portion to be made thicker to improve rigidity. In the present embodiment, a film thickness of the fourth insulating film 19 just above the gap end portion is set to be thicker than that of itself above a central portion of the gap. Further, with the fifth insulating layer 20, the effect of enhancing the rigidity of the above-gap membrane can be also obtained by making a film thickness of a portion of the fifth insulating film 20 positioned just above the gap end portion thicker than that of a portion thereof positioned above the central portion of the gap in the same manner. In the present embodiment, however, there is a disadvantage that the number of manufacturing steps (a patterning step, a film-forming step, and the like) is increased due to thickening of the fourth insulating film 19.

Third Embodiment

Figure 6:
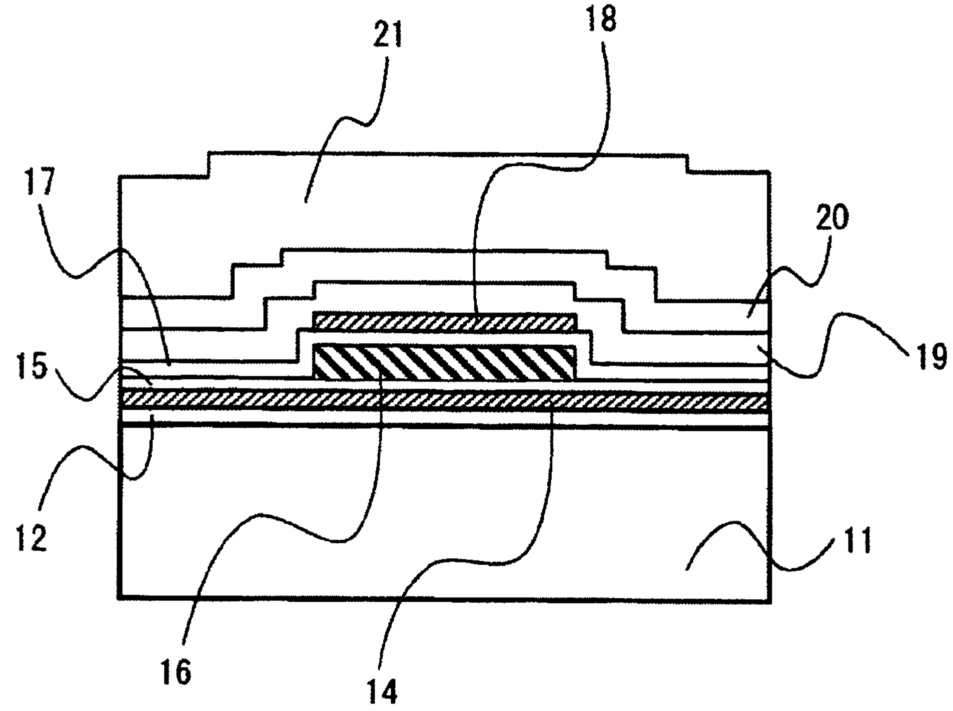
FIG. 6 is a sectional view of an ultrasonic transducer of a third embodiment of the present invention taken along line A-A.
Figure 7:
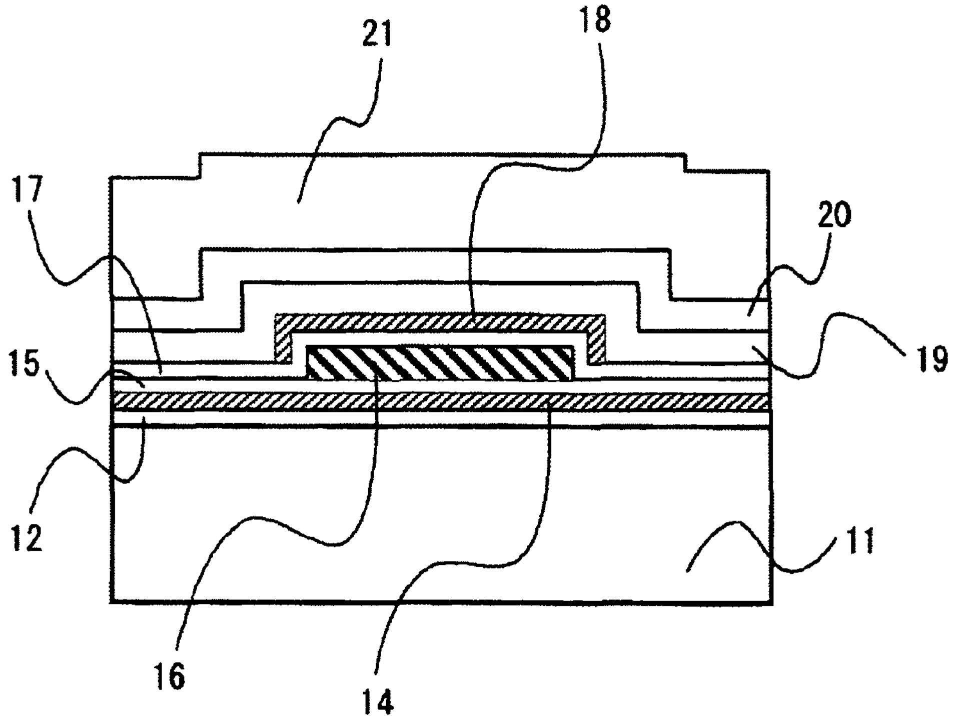
FIG. 7 is a sectional view of an ultrasonic transducer of the third embodiment of the present invention taken along line A-A.

FIG. 6 and FIG. 7 show a third embodiment of the present invention. The above object can be achieved by expanding the upper electrode 18 to the vicinity of the gap end portion (FIG. 6) or outside area of the gap end portion (FIG. 7). As shown in FIG. 7, when the upper electrode 18 is made large, a structure where the upper electrode 18 is turned along the third insulating film 17 so as to cover the gap can be adopted. Since the upper electrode 18 has deformation flexibility higher than that of the insulating film and it can relax rigidity, a distance from the end portion of the upper electrode 18 to the end portion of the gap 16 is reduced by expanding the upper electrode 18 in a horizontal direction, and warpage can be reduced by enhancing rigidities of the upper electrode 18 and the third to fifth insulating films 17, 19, and 20. When an area of the upper electrode 18 is set to at least 70% of an area of horizontal face of the gap 16, the distance from the end portion of the upper electrode 18 to the end portion of the gap 16 is reduced, so that the effect of the present invention can be achieved. It is further desirable that the area of the upper electrode 18 is made larger than that of the gap 16 in the horizontal face direction and the end portion of the upper electrode 18 is positioned outward of the end portion of the gap 16. Merits of the present embodiment include that, since only the upper electrode 18 is made large, the conventional fabricating method can be adopted and that since a portion in which charge injection occurs easily due to charge concentration generated at the end portion of the upper electrode 18 at a voltage application time can be positioned at the end portion of the gap 16 or outward of the end portion, characteristic change due to electric drift in the ultrasonic transducer can be reduced in addition to enhancing of the rigidity of the gap end portion.

In the present embodiment, the upper electrode is formed to extend to the gap end portion of the insulating film in order to relax the rigidity of the gap end portion without changing the film constitution or the fabricating method. Thereby, since the metal film having deformation flexibility higher than that of the insulating film can be formed at the gap end portion vibrated at a time of ultrasonic transmission/reception, the rigidity can be relaxed, so that the warpage of the above-gap membrane can be reduced.

What is claimed is:

1. An ultrasonic transducer for transmitting and receiving ultrasonic comprising:

a semiconductor substrate;

a first insulating film provided on the semiconductor substrate, wherein the first insulating film comprises silicon oxide;

a lower electrode provided on the first insulating film;

a second insulating film provided on the lower electrode, wherein the second insulating film comprises silicon oxide;

a gap provided above the second insulating film;

a third insulating film provided on the gap, wherein the third insulating film comprises silicon oxide;

an upper electrode provided above the third insulating film;

a fourth insulating film provided above the upper electrode, wherein the fourth insulating film is a compression stress layer, the fourth insulating film comprising silicon oxide; and a fifth insulating film provided on the fourth insulating film, wherein the fifth insulating film is a tensile stress layer, wherein the third insulating film, the upper electrode, the fourth insulating film and the fifth insulating film above the gap comprise a vibratable membrane.

2. The ultrasonic transducer according to claim 1, wherein the fifth insulating film is a silicon nitride film.

3. The ultrasonic transducer according to claim 1, wherein the thickness of either the fourth insulating film or the fifth insulating film is greater at the peripheral portion of the gap than at a central portion of the gap.

4. The ultrasonic transducer according to claim 1, wherein an area of the upper electrode is at least 70% of an area of a horizontal face of the gap.

5. The ultrasonic transducer according to claim 1, wherein an end portion of the upper electrode is positioned beyond an end portion of the gap.

6. An ultrasonic probe including the ultrasonic transducer according to claim 1.

7. A method for fabricating an ultrasonic transducer for transmitting and receiving ultrasonic comprising these steps:

a step of forming a silicon oxide film and a lower electrode on a semiconductor substrate;

a step of forming a sacrificial layer for forming a gap on the silicon oxide film;

a step of forming a third insulating film on the sacrificial layer, wherein the third insulating film comprises silicon oxide;

a step of forming an upper electrode on the sacrificial layer and the third insulating film;

a step of forming a fourth insulating film on the upper electrode, the fourth insulating film having compressive stress, wherein the fourth insulating film comprises silicon oxide;

a step of forming a through-hole extending to the sacrificial layer in the third insulating film and the fourth insulating film;

a step of removing the sacrificial layer; and a step of forming a fifth insulating film on the fourth insulating film and filling the through-hole with the fifth insulating layer, the fifth insulating film having tensile stress, wherein the third insulating film, the upper electrode, the fourth insulating film and the fifth insulating film above the gap comprise a vibratable membrane.

* * * * *